(12) United States Patent
Michaux et al.

(10) Patent No.: US 9,817,072 B2
(45) Date of Patent: Nov. 14, 2017

(54) AUXILIARY UNIT FOR AN ELECTRIC CIRCUIT BREAKER, ELECTRIC SYSTEM COMPRISING A CIRCUIT BREAKER AND ONE SUCH AUXILIARY UNIT AND METHOD FOR DETERMINING A CAUSE OF OPENING OF THE CIRCUIT BREAKER BY MEANS OF ONE SUCH AUXILIARY UNIT

(71) Applicant: Schneider Electric Industries SAS, Rueil-Malmaison (FR)

(72) Inventors: Marie-Laure Michaux, Vaulnaveys le Haut (FR); Sebastien Heraud, Grenoble (FR); Frederic Brasme, Le Bourg D'Oisans (FR); Lionel Urankar, Grenoble (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 386 days.

(21) Appl. No.: 14/483,448

(22) Filed: Sep. 11, 2014

(65) Prior Publication Data
US 2015/0070020 A1     Mar. 12, 2015

(30) Foreign Application Priority Data
Sep. 12, 2013  (FR) ..................... 13 58773

(51) Int. Cl.
*G01R 31/327* (2006.01)
*H01H 9/16* (2006.01)
(Continued)

(52) U.S. Cl.
CPC .......... *G01R 31/327* (2013.01); *H01H 9/167* (2013.01); *H01H 71/04* (2013.01); *H01H 47/002* (2013.01);
(Continued)

(58) Field of Classification Search
None
See application file for complete search history.

(56) References Cited

U.S. PATENT DOCUMENTS 9,140,756 B2 *  9/2015  Klapper ............. G01R 31/3272
2009/0090604 A1  4/2009  Srinivasan et al.
(Continued)

FOREIGN PATENT DOCUMENTS

EP      1 814 133 A1      8/2007
FR    EP 2267465 A1 *  12/2010  ............. H02H 3/042

OTHER PUBLICATIONS

Simon et al, EP 2267465, Device and method for indicating electrical faults, assembly and electric board comprising such a device (English Machine Translation, Published Dec. 29, 2010).*

(Continued)

*Primary Examiner* — Melissa Koval
*Assistant Examiner* — Felicia Farrow
(74) *Attorney, Agent, or Firm* — Oblon, McClelland, Maier & Neustadt, L.L.P.

(57) ABSTRACT

An auxiliary apparatus is coupled to an electric circuit breaker. In the open position, the breaker interrupts the circulation of a current in an electrical connection, which includes at least one electrical conductor and a mechanical output member movable between an operating position and a stop position associated with the interruption of the circulation of the current in the connection after opening of the breaker. The auxiliary apparatus includes at least one current sensor to measure the current circulating in a respective conductor, and a mechanical coupler to couple with the mechanical output member. The mechanical coupler also detects the opening of the breaker. The auxiliary apparatus also includes a device for determining a cause of the detected opening, based on the intensity measured by the current sensor.

9 Claims, 8 Drawing Sheets

(51) Int. Cl.
*H01H 71/04* (2006.01)
*H01H 47/00* (2006.01)
*H01H 71/02* (2006.01)
*H01H 71/10* (2006.01)

(52) U.S. Cl.
CPC . *H01H 71/1009* (2013.01); *H01H 2071/0278* (2013.01); *H01H 2071/042* (2013.01)

(56) References Cited

U.S. PATENT DOCUMENTS

| | | | |
|---|---|---|---|
| 2010/0019913 A1* | 1/2010 | Rodseth | H02H 3/046 340/638 |
| 2010/0277846 A1 | 11/2010 | Koshin et al. | |
| 2013/0043111 A1* | 2/2013 | Venkitachalam | H01H 71/04 200/329 |
| 2013/0197835 A1 | 8/2013 | Jonsson et al. | |
| 2015/0276877 A1* | 10/2015 | Biswas | G01R 31/3275 702/58 |

OTHER PUBLICATIONS

Kezunovic et al, Automated Monitoring and Analysis of Circuit Breaker Operation, IEEE Transactions on Power Delivery, vol. 20, No. 3 (Jul. 2005).*

French Preliminary Search Report dated May 9, 2014 in French Application 13 58773, filed on Sep. 12, 2013 ( with English translation of categories of Cited Documents).

* cited by examiner

AUXILIARY UNIT FOR AN ELECTRIC CIRCUIT BREAKER, ELECTRIC SYSTEM COMPRISING A CIRCUIT BREAKER AND ONE SUCH AUXILIARY UNIT AND METHOD FOR DETERMINING A CAUSE OF OPENING OF THE CIRCUIT BREAKER BY MEANS OF ONE SUCH AUXILIARY UNIT

BACKGROUND OF THE INVENTION

The present invention relates to an auxiliary apparatus for an electric circuit breaker, the electric circuit breaker being, in the open position, able to interrupt the circulation of a current in an electrical connection, the electrical connection including at least one electrical conductor, the electric circuit breaker including a mechanical output member, movable between an operating position and a stop position corresponding to the interruption of the circulation of the current in said electrical connection following opening of the circuit breaker.

The auxiliary apparatus comprises a mechanical coupling means for mechanical coupling with the mechanical output member, the mechanical coupling means forming means for detecting the opening of the circuit breaker.

The present invention also relates to an electric system comprising an electric circuit breaker and such an auxiliary apparatus mechanically coupled to the electric circuit breaker.

The present invention also relates to a method for determining a cause of opening of the electric circuit breaker using such an auxiliary apparatus.

An auxiliary apparatus of the aforementioned type is known. Such an auxiliary apparatus is also called a contact auxiliary, and includes a first coupling means with a trigger bar of the circuit breaker and a second coupling means with an actuating lever of the circuit breaker. It then makes it possible to determine whether the circuit breaker is open following manual actuation of the lever, the state of the circuit breaker then also being called the open state, or following the presence of a fault, such as an electric overload, on the electrical connection having caused the triggering of the circuit breaker, the state of the circuit breaker then also being called the fault triggered state. When the circuit breaker is in the closed position, the state of the circuit breaker is also called the closed state.

However, such an auxiliary apparatus only makes it possible to know the open, closed or fault triggered states and does not make it possible to more precisely know the cause of opening of the electric circuit breaker with which it is associated.

SUMMARY OF THE INVENTION

The aim of the invention is therefore to propose an auxiliary apparatus for an electric circuit breaker allowing better monitoring of said electric circuit breaker, in particular the determination of the cause of opening of the electric circuit breaker to which the auxiliary apparatus is mechanically coupled.

To that end, the invention relates to an auxiliary apparatus of the aforementioned type, wherein it further comprises at least one current sensor capable of measuring the intensity of the current circulating in a respective electrical conductor, and a determining device for determining a cause of the detected opening, based on the intensity measured by each current sensor, the determining device being connected to the mechanical coupling means and the current sensor.

According to other advantageous aspects of the invention, the auxiliary apparatus comprises one or more of the following features, considered alone or according to all technically possible combinations:
 the determining device comprises a comparison means for comparing the intensity measured by each current sensor with at least one predetermined threshold value;
 the comparison means is capable of comparing the measured intensity with a first threshold value in order to determine a first cause of opening and with a second threshold value in order to determine a second cause of opening;
 the determining device comprises a computing means for computing a duration during which the measured intensity is above a predetermined threshold value;
 the determining device comprises a dating means for dating the excess of the predetermined threshold value by the measured intensity and a memory for storing the dates of said excess;
 the electric circuit breaker comprises two mechanical output members, a first member among the two mechanical output members being movable in the stop position in case of overload on the electrical connection and the second member being able to be moved into the stop position in case of overload on the electrical connection or manual actuation of the electric circuit breaker, wherein the auxiliary apparatus comprises two mechanical coupling means, a first means among the two coupling means being mechanically coupled with the first output member and the second means being mechanically coupled with the second output member, and wherein the determining device is connected to the first and second mechanical coupling means, the cause of the opening being determined based furthermore on the position of the first mechanical output member and the position of the second mechanical output member; and
 the auxiliary apparatus further comprises a differential current sensor, and the determination device is capable of determining the cause of opening based on the intensity measured by each current sensor and the differential current measured by the differential current sensor.

The invention also relates to an electric system comprising an electric circuit breaker and an auxiliary apparatus mechanically coupled to the electric circuit breaker, the electric circuit breaker being, in the open position, capable of interrupting the circulation of an electric current in an electrical connection, the electrical connection including at least one electrical conductor, the electric circuit breaker including a mechanical output member movable between an operating position and a stop position corresponding to the interruption of the circulation of current in said electrical connection, wherein the auxiliary apparatus is as defined above.

According to another advantageous aspect of the invention, the electric system comprises the following feature:
 the electric system further comprises a differential trigger positioned between the electric circuit breaker and the auxiliary apparatus, the auxiliary apparatus being mechanically coupled to the mechanical output member of the electric circuit breaker.

The invention also relates to a method for determining a cause of opening of an electric circuit breaker using an auxiliary apparatus, the electric circuit breaker being, in the open position, capable of interrupting the circulation of an electric current in an electrical connection, the electrical connection including at least one conductor, the electric circuit breaker having a mechanical output member, movable between an operating position and a stop position corresponding to the interruption of the circulation of current in said electrical connection, the auxiliary apparatus comprising a mechanical coupling means for mechanical coupling with the mechanical output member, the method comprising the following steps:
the detection, via the mechanical coupling means, of the opening of the electric circuit breaker, and
the method being characterized in that it further comprises the following steps:
the measurement, by the auxiliary apparatus, of the intensity of the current circulating in each conductor, the apparatus further including a current sensor for each electrical conductor, and
the determination, by the auxiliary apparatus and based on the intensity measured by each current sensor, of a cause of the detected opening.

According to another advantageous aspect of the invention, the determining method comprises the following characteristics:
the electric circuit breaker comprises two mechanical output members, a first member among the two mechanical output members being able to be moved to the stopped position in case of an overload on the electrical connection and the second member being movable to the stopped position in case of an overload on the electrical connection or manual actuation of the electric circuit breaker,
wherein the auxiliary apparatus comprises two mechanical coupling means, a first means among the two coupling means being mechanically coupled with the first output member and the second means being mechanically coupled with the second output member, and
wherein, during the determination step, the cause of the opening is determined based furthermore on the position of the first mechanical output member and the position of the second mechanical output member.

BRIEF DESCRIPTION OF THE DRAWINGS

These features and advantages of the invention will appear upon reading the following description, provided solely as a non-limiting example, and done in reference to the appended drawings, in which.

DETAILED DESCRIPTION OF PREFERRED EMBODIMENTS

Figure 1:
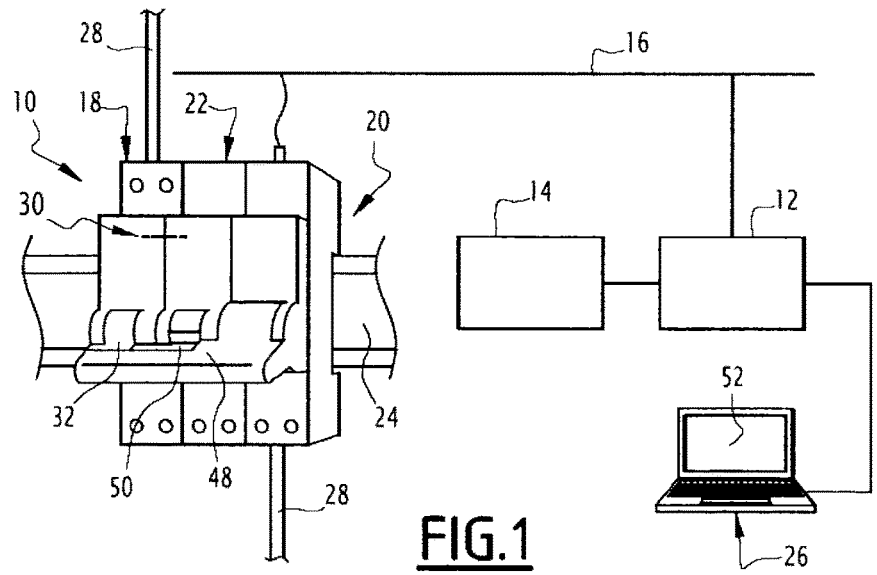
FIG. 1 is a diagrammatic illustration of an electric system according to the invention comprising an electric circuit breaker, a differential trigger and an auxiliary apparatus mechanically coupled to said circuit breaker and said differential trigger.

In FIG. 1, the electric system 10 is connected to a data concentrator 12 and an electrical power supply device 14 by a link 16.

The electric system 10 comprises an electric circuit breaker 18, such as an electrochemical circuit breaker, preferably a magnetothermal circuit breaker, and an auxiliary apparatus 20 mechanically coupled to the electric circuit breaker 18.

Additionally, in the example embodiment of FIG. 1, the electric system 10 comprises an electrical apparatus 22, such as a differential trigger, also called Vigi, arranged between the circuit breaker 18 and the auxiliary apparatus 20, the auxiliary apparatus 20 still being mechanically coupled to the circuit breaker 18.

The electric system 10 comprises a rail 24 on which the circuit breaker 18, the auxiliary apparatus 20 and the differential trigger 22 are arranged.

The data concentrator 12 is able to receive information relative to the operation of the circuit breaker 18 from the auxiliary apparatus 20 via the link 16.

The data concentrator 12 is connected to a viewing device 26, in particular in order to display the information relative to the operation of the circuit breaker 18.

The electric power supply device 14 is capable of supplying electricity to the auxiliary apparatus 20 via the link 16. The electric voltage delivered by the power supply device 14 is, for example, a direct voltage substantially equal to 24 V.

The link 16 is a link making it possible to transmit both data and electricity, the data being able to be transmitted in both directions between the data concentrator 12 and the auxiliary apparatus 20, and the electricity being delivered by the power supply device 14.

In the example embodiment of FIG. 1, the link 16 is a wired link. The link 16 is, for example, in accordance with the IO-Link communication protocol.

Figure 2:
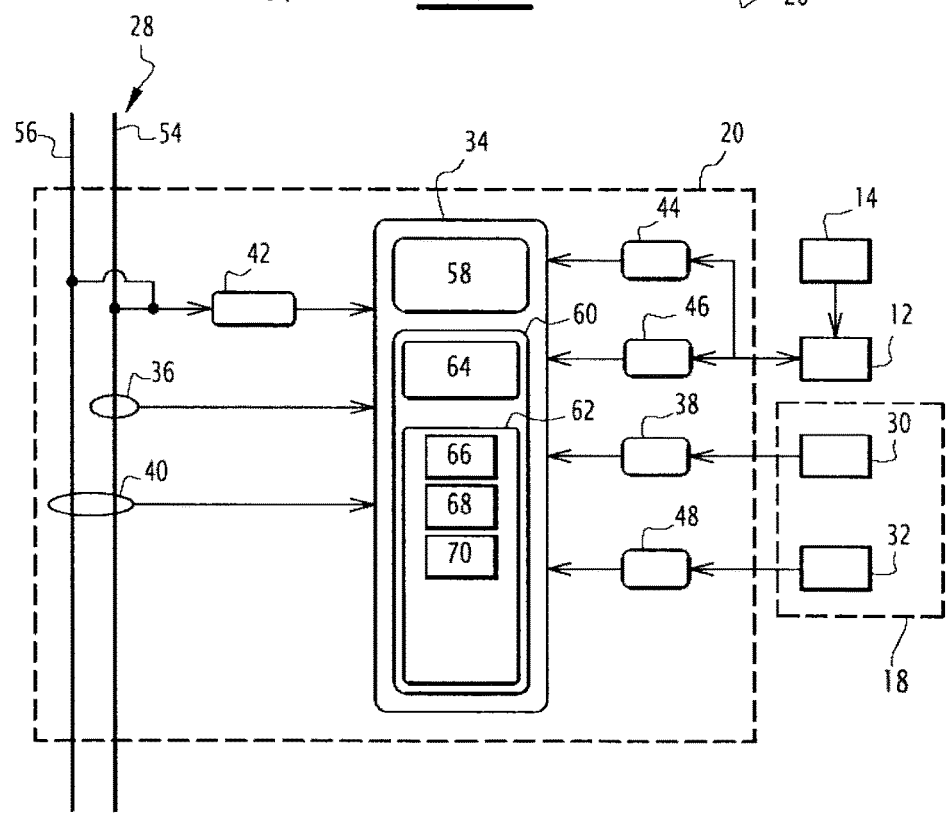
FIG. 2 is a very diagrammatic illustration of the auxiliary apparatus of FIG. 1.

The electric circuit breaker 18 is known in itself and is capable of interrupting the circulation of an electric current in an electrical connection 28, shown in FIG. 2, in particular in the presence of a fault on the electrical connection 28.

The circuit breaker 18 includes a first mechanical output member 30, shown diagrammatically in FIG. 2, and a second mechanical output member 32, shown in FIG. 1, each mechanical output member 30, 32 being movable between an operating position and a stop position corresponding to the interruption of the circulation of current in said electrical connection 28 following opening of the circuit breaker. The first mechanical output member 30 is movable into the stop position in case of an overload on the electrical connection 28. The second mechanical output member 32 can be moved into the stop position in case of an overload on the electrical connection 28 or the manual control of the electric circuit breaker 18.

The electric circuit breaker 18 is, for example, a magnetothermal circuit breaker capable of interrupting the circulation of current in the electrical connection 28 in the case of an overload by thermal effect and in the case of a short-circuit by magnetic effect.

The auxiliary apparatus 20 comprises an information processing unit 34, a current sensor 36, such as a phase current sensor in the case of an alternating current, and a first mechanical coupling means 38 for mechanical coupling with the first mechanical output member 30.

Additionally, in the case of an alternating current, the auxiliary apparatus 20 comprises a differential current sensor 40 capable of measuring a differential current of the electrical connection 28.

The auxiliary apparatus 20 comprises a sensor 42 for measuring the voltage of the electrical connection 28, a converter 44 for converting a direct current into another direct current, and a communication module 46.

Additionally, the auxiliary apparatus 20 comprises a second mechanical coupling means 48 for mechanical coupling with the second mechanical output member 32, as shown in FIG. 1.

The differential trigger 22 is fastened on the rail 24 between the circuit breaker 18 and the auxiliary apparatus 20. The differential trigger 22 includes an opening, not shown, for the passage of a mechanical linking member between the first mechanical output member 30 and the first mechanical coupling member 38.

The differential trigger 22 includes a lever 50 for rearming the circuit breaker, the rearming lever 50 not being mechanically coupled to the second mechanical coupling means 48.

The electric differential trigger 22 is capable of limiting the risks of electrocution by detecting current leaks to an electric ground.

The rail 24 is for example a DIN (from the German Deutsches Institut für Normung) rail.

The viewing device 26 in particular includes a display screen 52 and a display means (not shown) for displaying data received from the data concentrator 12 on the screen.

The electrical connection 28, shown in FIG. 2, includes a first electrical conductor 54, such as a phase conductor, or a positive direct potential conductor, and a second electrical conductor 56, such as a neutral conductor or a reference direct potential conductor.

The first mechanical output member 30 is known in itself, and is also called trigger bar. The trigger bar 30 is movable between its operating position and its stop position, corresponding to a triggered state of the circuit breaker 18, that state also being called fault triggered state, i.e. the state in which the circuit breaker 18 is found after an activation due to a fault, such as a short circuit or an electrical overload, that triggering causing the interruption of the circulation of the current in the electrical connection 28 in order to isolate said electric fault. The operating position of the first mechanical output member 30 corresponds to a closed state of the circuit breaker 18, i.e. the state allowing the circulation of current in the electrical connection 28, or an open state of the circuit breaker 18, i.e. the state in which the circuit breaker 18 is found after having been opened manually. The open state of the circuit breaker 18 corresponds to an interruption of the circulation of current in the electrical connection 28.

The second mechanical output member 32 is separate from the first mechanical output member 30. The second mechanical output member 32 is known in itself, and is also called the rearming lever 32 of the circuit breaker. The rearming lever 32 makes it possible to rearm the circuit breaker 18 after triggering, i.e. to cause the circuit breaker 18 to go from its open state to its closed state, in order to once again allow the current to circulate in the electrical connection 28. The lever 32 also makes it possible to open the circuit breaker 18 manually. The rearming lever 32 is movable between its operating position, corresponding to the closed state of the circuit breaker 18, and its stop position, corresponding to the open state of the circuit breaker 18 in case of manual actuation thereof, or to the triggered state of the circuit breaker 18 in case of overload or short circuit on the electrical connection.

The information processing unit 34 includes a processor 58 and a memory 60 associated with the processor 58. The memory 60 is capable of storing an application 62 for determining the cause of a detected opening based on the intensity measured by the phase current sensor 36. The memory 60 is also capable of storing software 64 for sampling the intensity measured by the phase current sensor 36, the differential current measured by the differential current sensor 40 and the voltage measured by the voltage sensor 42. The memory 60 is also able to store intensity measurement samples measured by the current sensors 36, 40 as well as voltage samples measured by the voltage sensor 42, and to store the positions of the mechanical members 30, 32 of the circuit breaker.

The current sensor 36 is known in itself and is capable of measuring the intensity I of the current circulating in the electrical conductor 54. The current sensor 36 is for example a phase current sensor, and then for example includes a Rogowski coil, a shunt or a Hall effect sensor.

The first mechanical coupling means 38 forms means for detecting fault triggering of the circuit breaker 18. The first mechanical coupling means 38 includes a mechanical interface with the first mechanical output member 30.

The differential current sensor 40 is known in itself and is, for example, in the form of a coil surrounding both the conductor 54 and the conductor 56, as shown in FIG. 2.

The voltage sensor 42 is able to measure the voltage of the conductor 54 relative to the conductor 56.

The direct-direct converter 44 is able to convert the direct voltage received from the power supply device 14 into another direct voltage with a lower value able to supply the microprocessor 34. The direct-direct converter 44 is, for example, capable of converting a direct voltage of approximately 24 V into a direct voltage of approximately 5 V.

The communication module 46 is able to receive data via the wired link in order to next send that data to the information processing unit 34 and/or to emit data from the information processing unit 34 to the data concentrator 12 via the wired link 16.

Alternatively, the communication module 46 is able to communicate with the data concentrator 12 via a wireless data link.

The second mechanical coupling means 48 forms means for detecting the opening or closing of the circuit breaker 18, the opening of the circuit breaker 18 corresponding to the open state or the fault triggered state of said circuit breaker 18.

The second mechanical coupling means 48 is in the form of a lever extended by an arm having a U-shaped cross-section, the arm cooperating with the rearming lever 32 of the circuit breaker 18 due to its U-shaped cross-section. The second mechanical coupling means 48 does not cooperate with the rearming lever 50 of the differential trigger, and said lever 50 is left free relative to the second mechanical coupling means 48.

The rearming lever 50 of the differential trigger is known in itself and similar to that of the circuit breaker 18. It makes it possible to rearm the differential trigger 22 after triggering, i.e. to cause the differential trigger 22 to go from its triggered state to its engaged state.

The determining application 62 is able to determine the cause of a detected opening based on the intensity I measured by the current sensor 36 and the position of the first mechanical member 30 and/or the second mechanical member 32.

Additionally, when the auxiliary apparatus 20 also includes a differential current sensor 40, the determining application 62 is able to determine the cause of the opening based on the intensity I measured by the current sensor 36 and the differential current Id measured by the differential current sensor 40.

The determining application 62 comprises comparison software 66 for comparing the intensity I measured by the current sensor 36 with at least one predetermined threshold value S1, S2.

The determining application 62 includes software 68 for computing a duration during which the measured intensity I is above the predetermined threshold value S1, S2.

Additionally, the determining application 62 includes software 70 for dating the excess of the predetermined threshold value S1, S2 by the measured intensity I, said excess being able to be stored in the memory 60 of the information processing unit.

The comparison software 66 is able to compare the measured intensity I with a first threshold value S1 in order to determine a first cause of opening and with a second threshold value S2 in order to determine a second cause of opening.

The operation of the electric system 10 according to the invention will now be explained using FIGS. 3 and 4.

During the initial step 100, the second mechanical coupling means 48 detect that the second mechanical output member 32 is in the lower position, also called stop position, i.e. that the circulation of the current in the electrical connection 28 is interrupted by opening the circuit breaker 18, and send the information from the detected opening to the information processing unit 34. The information processing unit 34 then launches the determining application 62 in order to determine the cause of the detected opening.

As long as the second mechanical output member 32 is in the operating position, i.e. the upper position, the determining application 62 remains in step 100. During the initial step, the current and voltage values are regularly measured by the sensors 36 and 42, or by the differential current sensor 40.

During the following step 110, after having detected the opening of the circuit breaker 18 using the second mechanical coupling means 48, the determining application 62 uses the first mechanical coupling means 38 to determine the position of the trigger bar 30 in order to determine whether the opening of the circuit breaker 18 is due to triggering produced by an electrical fault or manual opening. In fact, the trigger bar 30 remains in the operating position when the electric circuit breaker 18 is manually triggered. In other words, step 110 aims to determine whether fault signaling information, also denoted SD, is present, i.e. whether the trigger bar 30 is in the stop position.

If fault signaling information is not present, i.e. if the trigger bar 30 is in the operating position, then the determining application 62 concludes, during step 120, that the opening of the circuit breaker 18 is due to manual opening. Otherwise, if the information SD is present, i.e. if the trigger bar 30 is in the stop position, then the determining application 62 goes on to step 130.

During step 130, the comparing software 66 compares the intensity I measured by the current sensor 36 with the first threshold value S1 in order to determine whether the opening of the circuit breaker 18 is of outside origin (manual or auxiliary) or due to the detection of an overload or a short circuit by thermal effect. In fact, it involves estimating the thermal stress over time, either by integration over a sliding fixed time window (circulating buffer), or by comparison with an effective value of I to the first threshold value S1.

Figure 4:
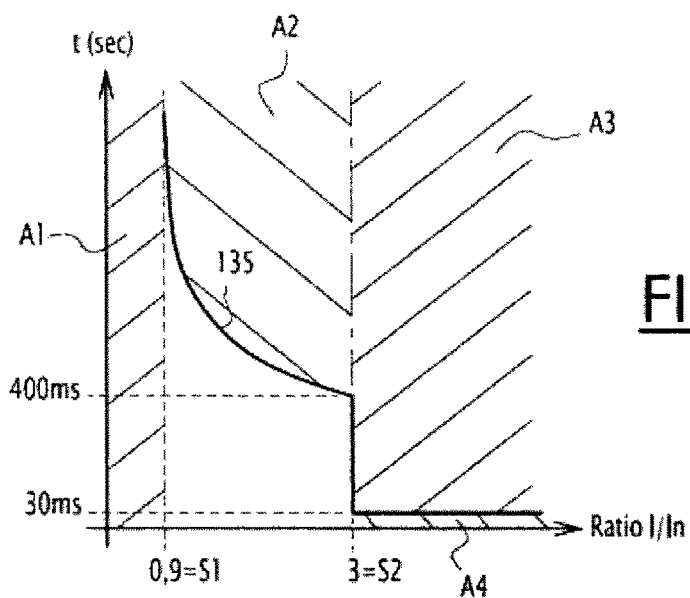
FIG. 4 is a trigger curve of the circuit breaker.

The first threshold value S1 depends on the trigger curve 135 of the circuit breaker 18, shown in FIG. 4. The first threshold value S1 is for example equal to 0.9 times the rated intensity, denoted In.

If the result of the comparison of the measured intensity I with the first threshold value S1 is negative, i.e. if the measured intensity I is less than or equal to the first threshold value S1, for example equal to 0.9×In, then the circuit breaker 18 is at a first zone A1, shown in FIG. 4. The determining application 62 concludes from this, during step 140, that the opening of the circuit breaker 18 is due to the reception of a control signal for the triggering, such as a ground current leak detected by the differential trigger 22 (signal SD_Vigi) or a triggering caused by an auxiliary outside the circuit breaker 18 (signal SD_extern).

Otherwise, i.e. if the value of the measured intensity I is above the first threshold value S1, then the determining application 62 goes on to step 150, during which the comparison software 66 compares the measured intensity I with the second threshold value S2.

The second threshold value S2 also depends on the trigger curve 135 of the circuit breaker 18, and is for example equal to 3 times the rated intensity In.

If the result of the comparison in step 150 is negative, i.e. if the measured intensity is comprised between the first threshold value S1 and the second threshold value S2, then the determining application 62 concludes, during step 160, that the cause of the opening is an overload, the circuit breaker 18 then being triggered by thermal effect, and the determining application 62 returns the information SD_thermic. In fact, when the measured intensity is comprised between the first threshold value S1 and the second threshold value S2 and the circuit breaker 18 has been triggered, the circuit breaker 18 is in a second zone A2, shown in FIG. 4.

Otherwise, in the event the comparison with the second threshold value S2 is positive, i.e. if the measured intensity is greater than the second threshold value S2, for example equal to 3×In, then the determining application 62 goes on to step 170.

During step 170, the computation software 68 then computes a duration Δt during which the measured intensity I was above the second threshold value S2 before detection of the opening. If the computed duration Δt is greater than 30 ms, then the circuit breaker 18 is in a third zone A3, shown in FIG. 4, which corresponds to triggering by thermal effect due to an overload. The determining application 62 then concludes, during step 180, that the cause of the opening is an overload having caused triggering by thermal effect and returns the information SD_thermic.

Otherwise, if the computed duration Δt is less than 30 ms, i.e. if the circuit breaker 18 is in a fourth zone A4, shown in FIG. 4, then the determining application 62 concludes, during step 190, that the opening of the circuit breaker 18 occurred via triggering by magnetic effect, triggering by magnetic effect being faster than triggering by thermal effect, and then returns information SD_magnetic. In that case, the cause of opening the circuit breaker 18 is a short circuit.

At the end of steps 120, 140, 160, 180 or 190, the determining application 62 returns to the initial step 100.

The auxiliary apparatus 20 according to the invention thus makes it possible to determine the cause of the detected opening for the electric circuit breaker 18 from among the different possible causes, namely a short circuit, an overload, an outside trigger (manual or by an auxiliary apparatus).

Figure 3:
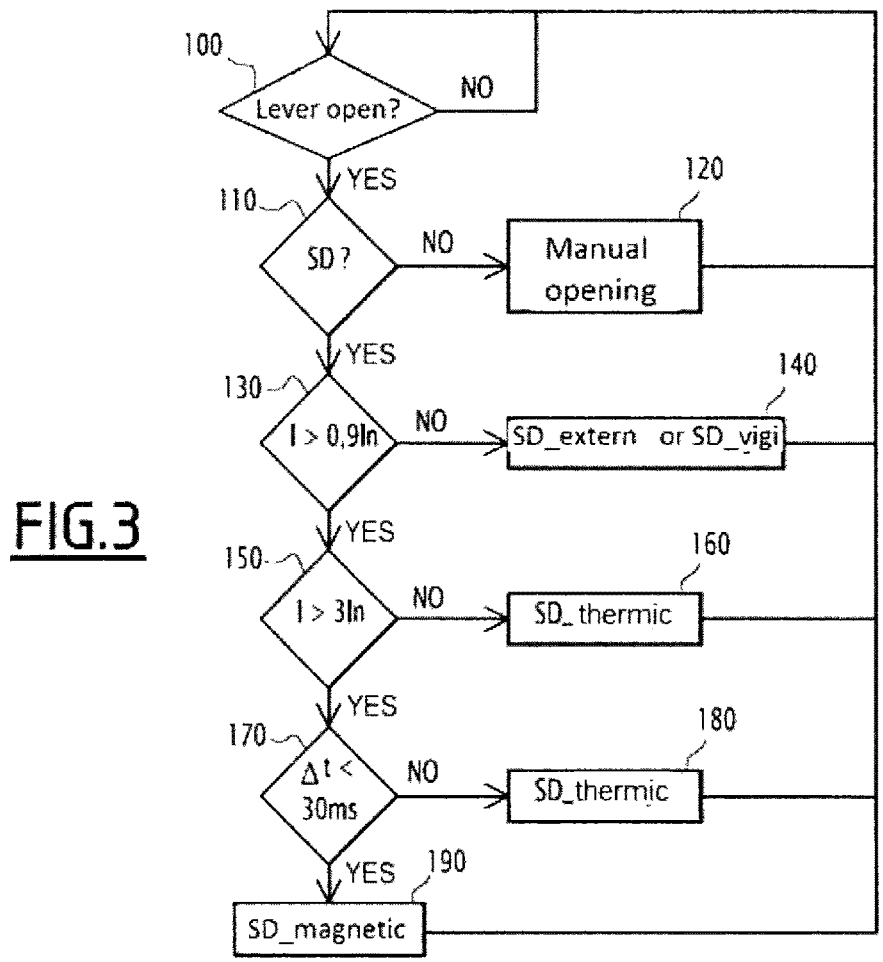
FIG. 3 is a flowchart of a method, according to a first embodiment, for determining a cause of an opening detected for the circuit breaker of FIG. 1.

In the example embodiment of FIG. 3, the opening of the circuit breaker 18 is initially detected by the second mechanical coupling means 48.

Alternatively, the opening of the circuit breaker 18 is initially detected by the first mechanical coupling means 38 and the determining method goes directly to step 130. The auxiliary apparatus 20 according to the invention makes it possible to determine the cause of the detected opening for the electric circuit breaker 18 from among the following different causes: a short circuit, an overload, or a manual maneuver of the apparatus.

The determining application 62 then returns the information corresponding to the determined cause of the detected opening to the data concentrator 12 in order to improve the supervision of the electric system 10.

The auxiliary apparatus 20 according to the invention further makes it possible to measure the charge rate of the circuit breaker 18 in order to monitor the risk of overload triggering.

Furthermore, the auxiliary apparatus 20 according to the invention makes it possible to measure the leak rate of the circuit breaker 18 using the differential current sensor 40 and emit an alarm to the data concentrator 12 in case of risk of differential triggering of the differential trigger 22. Likewise, the differential current sensor 40 makes it possible to determine whether the outside trigger was commanded by the differential trigger 22.

When the current sensor 36 is a linear sensor, such as a Rogowski coil, a shunt, or another means, the measuring dynamics are better, which makes it possible to improve the determination of the cause of the detected triggering.

Furthermore, it is not necessary to replace the circuit breaker 18, since the auxiliary apparatus 20 according to the invention is mechanically coupled to the circuit breaker 18 without modifying the latter.

Furthermore, the only link between the circuit breaker 18 and the auxiliary apparatus 20 being the mechanical coupling of the triggering bar 30 with the first mechanical coupling means 38, the auxiliary apparatus 20 according to the invention does not disrupt the protection functions of the circuit breaker 18 and/or the differential trigger 22.

One can thus see that the auxiliary apparatus 20 according to the invention allows better monitoring of the circuit breaker 18, in particular the determination of the cause of triggering in case of triggering of the circuit breaker 18 to which the auxiliary apparatus 20 is mechanically coupled is detected.

Figure 5:
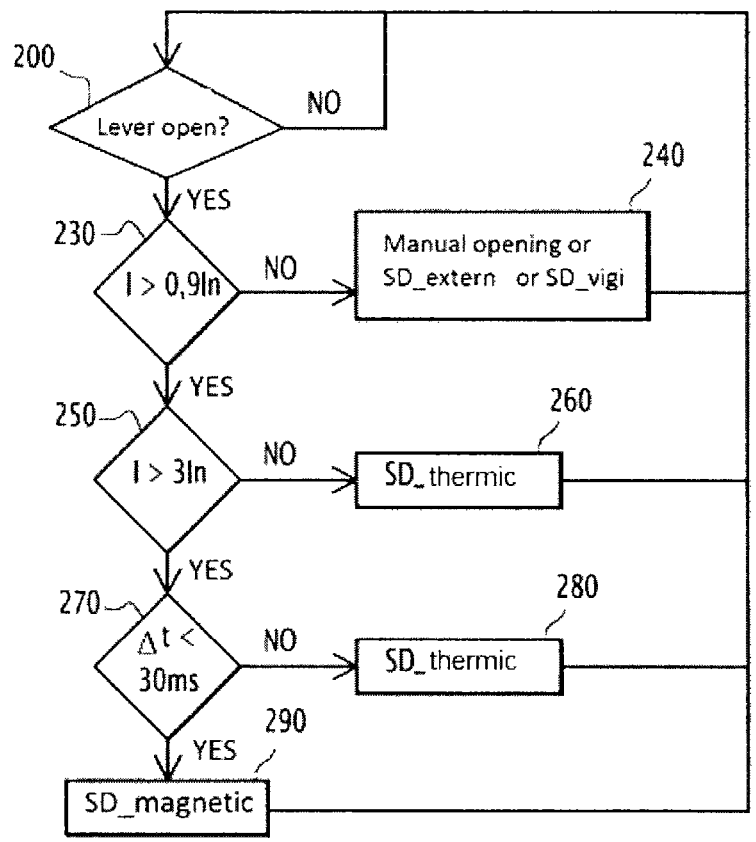
FIGS. 5 and 6 are views similar to that of FIG. 3 according to a first alternative and a second alternative embodiment of the determining method according to the first embodiment, respectively.

FIG. 5 illustrates a first alternative of the determining method previously described in light of FIG. 3. According to this first alternative, the position of the first mechanical output member 30 is not taken into account, and the auxiliary apparatus 20 does not necessarily include the first mechanical coupling means 38.

The initial step 200 of the determining method according to this first alternative is identical to step 100, and the determining application 62 next goes directly to step 230.

During step 230, which is identical to step 130 previously described, the comparison software 66 compares the intensity I measured by the current sensor 36 with the first threshold value S1 in order to determine whether the opening of the circuit breaker 18 is of outside origin (manual or auxiliary) or due to the detection of an overload or a short circuit by thermal effect.

The first threshold value S1 depends on the trigger curve 135 of the circuit breaker 18, shown in FIG. 4. The first threshold value S1 is for example equal to 0.9 times the rated intensity, denoted In.

If the result of the comparison of the measured intensity I with the first threshold value S1 is negative, i.e. if the measured intensity I is less than or equal to the first threshold value S1, then the circuit breaker 18 is in a first zone A1, shown in FIG. 4. The determining application 62 concludes from this, during step 240, that the opening of the circuit breaker 18 is due to the reception of a command signal for the triggering, such as a ground current leak detected by the differential trigger 22 (signal SD_Vigi) or a triggering caused by an auxiliary outside the circuit breaker 18 (signal SD_extern), or manual opening.

Otherwise, i.e. if the value of the measured intensity I is greater than the first threshold value S1, then the determining application 62 goes on to step 250, during which the comparison software 66 compares the measured intensity I with the second threshold value S2.

The following of the determining method according to this first alternative is then identical to that of the determining method of FIG. 3, and steps 250, 260, 270, 280 and 290 are respectively identical to steps 150, 160, 170, 180 and 190, the same causes for opening as in steps 160, 180 or 190 being determined in steps 260, 280 or 290 by the determining application 62.

At the end of steps 240, 260, 280 or 290, the determining software 62 returns to the initial step 200.

The auxiliary apparatus 20 according to the invention thus makes it possible to determine the cause of the detected opening for the electric circuit breaker 18 from among the different possible causes, i.e. a short circuit, an overload, outside triggering (manual or by an auxiliary apparatus), all while using only the second mechanical coupling means 48 from among the two possible mechanical coupling means 38, 48.

Figure 6:
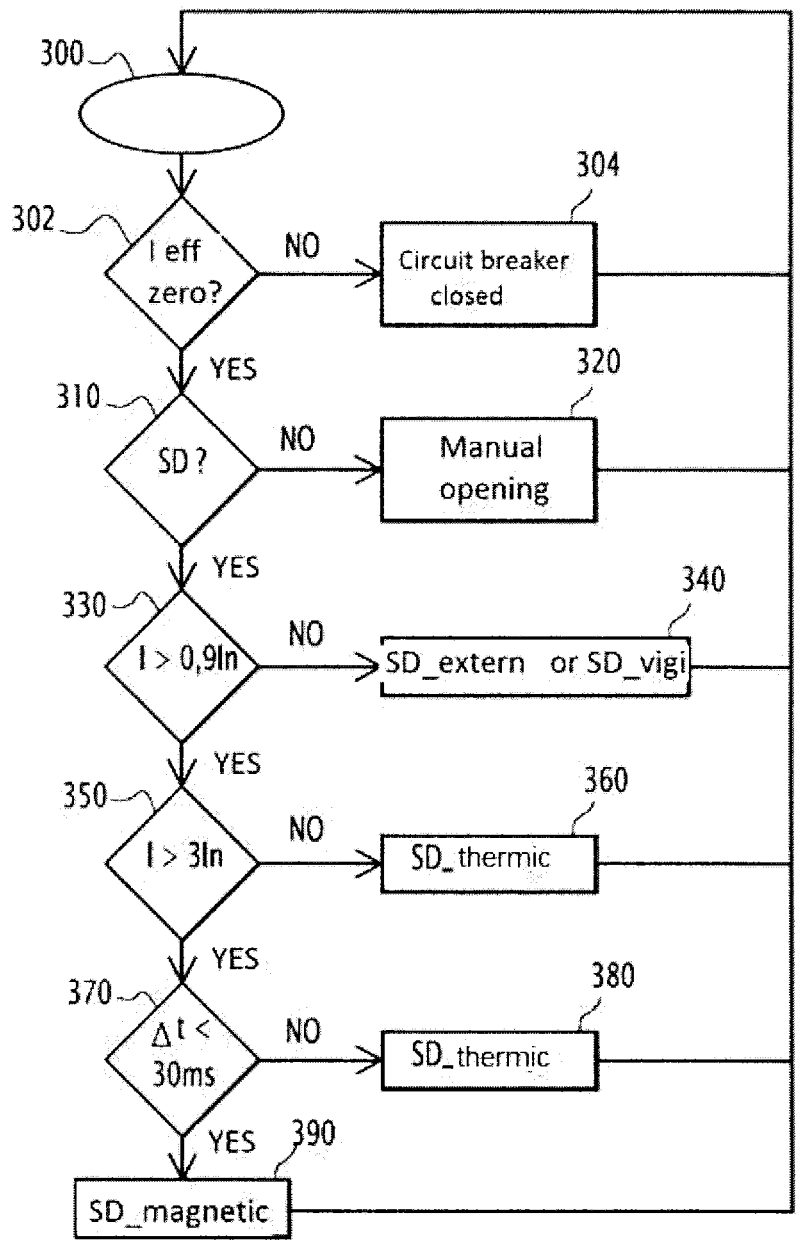

FIG. 6 illustrates a second alternative of the determining method previously described in light of FIG. 3. According to this second alternative, the position of the second mechanical output member 32 is not taken into account, and the auxiliary apparatus 20 does not necessarily include the second mechanical coupling means 48.

Initial step 300 of the determining method according to this second alternative is a step for measuring and acquiring current and voltage values, and the determining application 62 next goes on to step 302.

Additionally, the determining application 62 includes a second computation software, not shown, the second computation software being able to compute an effective value of the current $I_{eff}$.

During step 302, the second computation software computes the effective value of the current $I_{eff}$ and determines whether the latter is zero to within an allowance.

If the effective value of the current $I_{eff}$ is not zero, then the determining application 62 deduces, during step 304, that the circuit breaker 18 is still in the closed state, and returns to the initial step 300.

Otherwise, the determining application 62 goes on to step 310, which is identical to step 110 previously described.

The following of the determining method according to this second alternative is then identical to that of the determining method according to FIG. 3, and steps 320, 330, 340, 350, 360, 370, 380 and 390 are respectively identical to steps

120, 130, 140, 150, 160, 170, 180 and 190, the same opening causes as in steps 120, 140, 160, 180 or 190 being determined in steps 320, 340, 360, 380 or 390 by the determining application 62.

At the end of steps 320, 340, 360, 380 or 390, the determining application 62 returns to the initial step 300.

The auxiliary apparatus 20 according to the invention thus makes it possible to determine the cause of the detected opening for the electric circuit breaker 18 from among the different possible causes, i.e. a short circuit, an overload, outside triggering (manual or by an auxiliary apparatus), all while using only the first mechanical coupling means 38 from among the two possible mechanical coupling means 38, 48.

Figure 7:
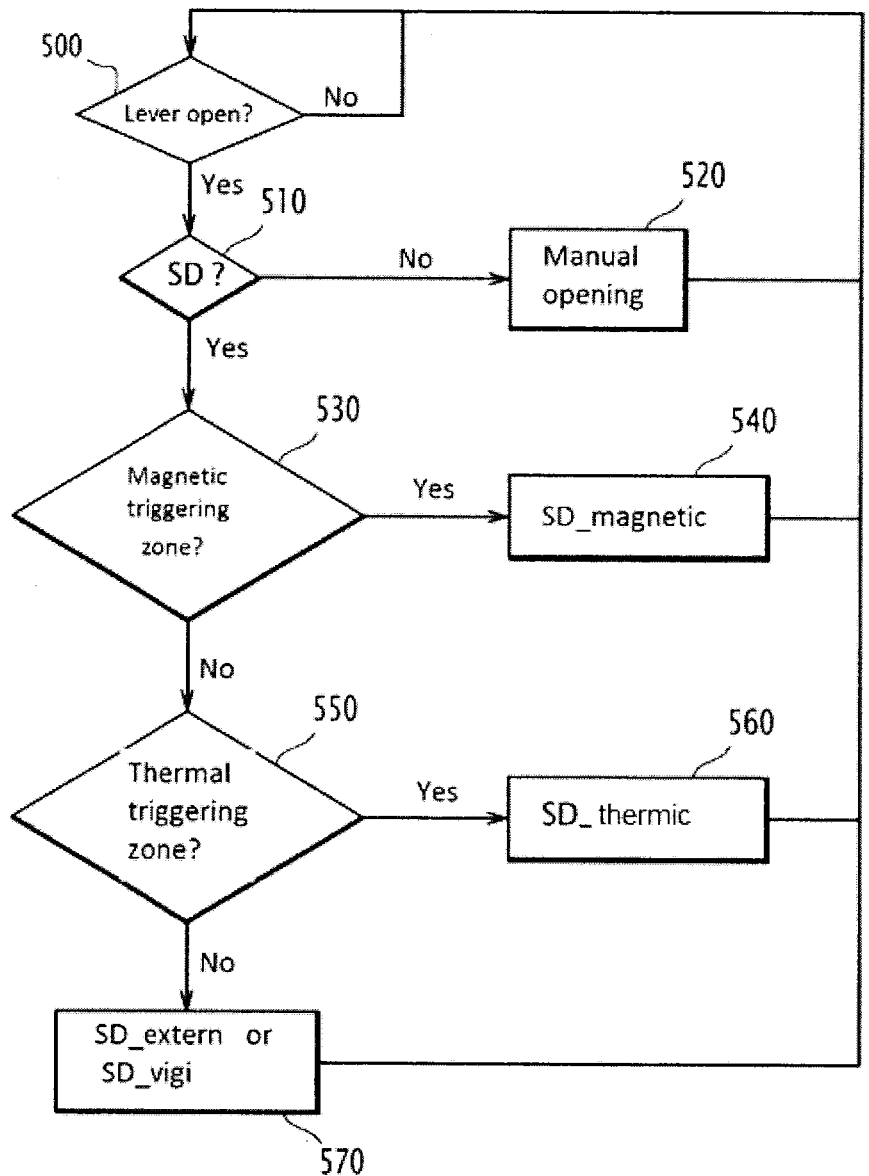
FIG. 7 is a flowchart of the determining method according to a second embodiment.

FIG. 7 illustrates a second embodiment of the determining method, in which the elements similar to the first embodiment previously described are identified using identical references, and are not described again.

According to this second embodiment, the determining method is based on the energy transposition of the trigger curve of FIG. 4, in order to obtain a curve representing the energy as a function of time. The energy computed using this second embodiment is proportional to the following sum:

$$\Sigma I^2 \cdot \Delta t,$$

where $\Delta t$ is a sampling period.

The curve is computed regularly on sliding windows representing each of the different time periods during which the energy is accumulated. These energy computations as a function of time make it possible to represent the energy circulating in the circuit breaker 18 for time periods comprised between 0 seconds and a predetermined period, such as a duration of 2 hours.

The determining application 62 includes third computation software capable of computing an energy E(t) at a moment t, then able to determine whether the energy E(t) computed at moment t corresponds to a magnetic triggering zone, a thermal triggering zone, or another operating zone of the circuit breaker 18.

The initial step 500 of the determining method according to this third alternative is identical to the initial step 100, and the determining application 62 next goes directly to step 510, which is identical to step 110 of the method of FIG. 3.

If, during step 510, the fault signaling information is not present, i.e. if the trigger bar 30 is in the operating position, then the determining application 62 concludes during step 520 that the opening of the circuit breaker 18 is due to manual opening. Otherwise, if the information SD is present, i.e. if the trigger bar 30 is in the stop position, then the determining application 62 goes on to step 530.

During step 530, the third software computes the energy E(t) at moment t, and determines the computed energy corresponds to the magnetic triggering zone. If applicable, the determining application 62 concludes, during step 540, that the opening of the circuit breaker 18 has occurred via magnetic effect triggering, and then returns information SD_magnetic. In that case, the cause of opening the circuit breaker 18 is a short circuit.

Otherwise, i.e. if the computed energy E(t) does not correspond to the magnetic zone, then the third computation software determines, during step 550, whether the computed energy corresponds to the thermal triggering zone. If applicable, the determining application 62 concludes from this, during step 560, that the cause of the opening is an overload, the circuit breaker 18 then being triggered by thermal effect, and the determining application 62 returns the information SD_thermic.

Otherwise, i.e. if the computed energy E(t) also does not correspond to the thermal zone, then the determining application 62 concludes from that, during step 570, that the opening of the circuit breaker 18 is due to the reception of a command signal of the triggering, such as a ground currently leak detected by the differential trigger 22 (signal SD_Vigi) or triggering caused by an auxiliary outside the circuit breaker 18 (signal SD_extern).

At the end of steps 520, 540, 560 or 570, the determining application 62 returns to the initial step 500.

Figure 8:
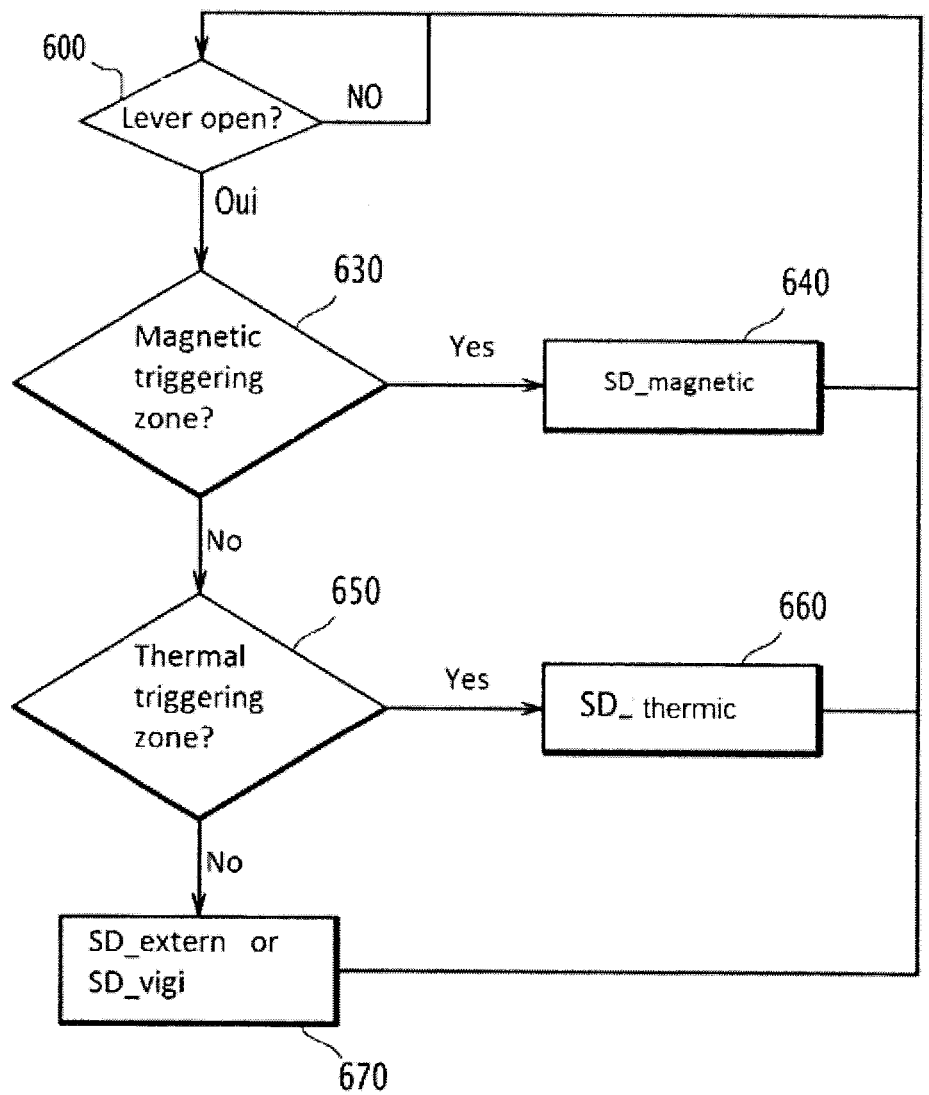
FIGS. 8 and 9 are views similar to that of FIG. 7 according to a first alternative and a second alternative embodiment of the determining method according to the second embodiment, respectively.

FIG. 8 illustrates a first alternative of the determining method according to the second embodiment previously described in light of FIG. 7. According to this first alternative, the position of the first mechanical output member 30 is not taken into account, and the auxiliary apparatus 20 does not necessarily include the first mechanical coupling means 38.

The initial step 600 of the determining method according to this first alternative is identical to step 500, and the determining application 62 next goes directly to step 630.

During step 630, which is identical to step 530 previously described, the third software computes the energy E(t) at moment t, and determines the computed energy corresponds to the magnetic triggering zone. If applicable, the determining application 62 concludes, during step 540, that the opening of the circuit breaker 18 has occurred via magnetic effect triggering, and then returns information SD_magnetic. In that case, the cause of opening the circuit breaker 18 is a short circuit.

Otherwise, i.e. if the computed energy E(t) does not correspond to the magnetic zone, then the third computation software determines, during step 650, whether the computed energy corresponds to the thermal triggering zone.

The following of the determining method according to this first alternative relative to the second embodiment is identical to that of the determining method of FIG. 7, and steps 650, 660 and 670 are respectively identical to steps 550, 560 and 570, the same opening causes as steps 540, 560 or 570 being determined in steps 640, 660 or 670 by the determining application 62.

At the end of steps 640, 660 or 670, the determining application 62 returns to the initial step 600.

The auxiliary apparatus 20 according to the invention thus makes it possible to determine the cause of the detected opening for the electric circuit breaker 18 from among the different possible causes, i.e. a short circuit, an overload, outside triggering (manual or by an auxiliary apparatus), all while using only the second mechanical coupling means 48 from among the two possible mechanical coupling means 38, 48.

Figure 9:
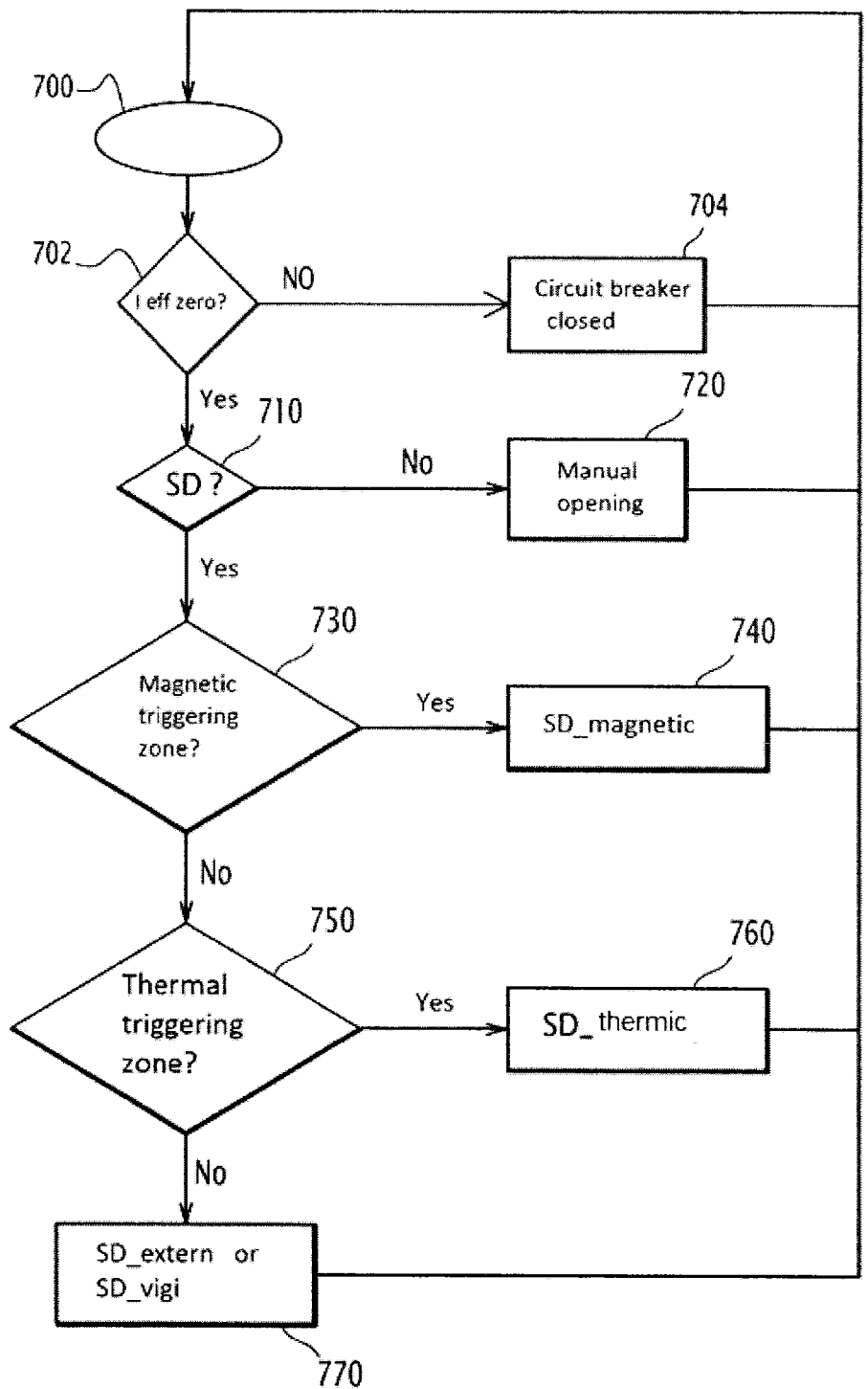

FIG. 9 illustrates a second alternative of the determining method according to the second embodiment previously described in light of FIG. 7. According to this second alternative, the position of the second mechanical output member 32 is not taken into account, and the auxiliary apparatus 20 does not necessarily include the second mechanical coupling means 48.

The initial step 700 of the determining method according to this second alternative is a step for measuring and acquiring current and voltage values, and the determining application 62 next goes on to step 702.

Additionally, the determining application 62 includes a second computation software, not shown, the second computation software being able to compute an effective value of the current $I_{eff}$.

During step 702, the second computation software computes the effective value of the current $I_{eff}$, and determines whether the value is zero to within an allowance.

If the effective value of the current $I_{eff}$ is not zero, then the determining application 62 deduces from that, during step 704, that the circuit breaker 18 is still in the closed state, and returns to the initial step 300.

Otherwise, the determining application 62 goes on to step 710, which is identical to step 510 previously described.

The following of the determining method according to this second alternative is identical to that of the determining method of FIG. 7 according to the second embodiment, and steps 720, 730, 740, 750, 760 and 770 are respectively identical to steps 520, 530, 540, 550, 560 and 570, the same opening causes as in steps 520, 540, 560 or 570 being determined in steps 720, 740, 760 or 770 by the determining application 62.

At the end of steps 720, 740, 760 or 770, the determining application 62 returns to the initial step 700.

The auxiliary apparatus 20 according to the invention thus makes it possible to determine the cause of the detected opening for the electric circuit breaker 18 from among the different possible causes, i.e. a short circuit, an overload, outside triggering (manual or by an auxiliary apparatus), all while using only the first mechanical coupling means 38 from among the two possible mechanical coupling means 38, 48.

Figure 10:
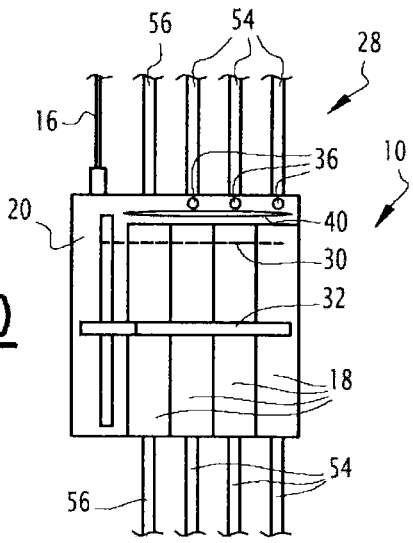
FIG. 10 is a diagrammatic illustration of the electric system according to a third embodiment.

FIG. 10 illustrates a third embodiment of the invention, for which the elements similar to the first embodiment, previously described, are identified using identical references, and are not described again.

According to the third embodiment, the current circulating in the electrical connection 28 is a three-phase current and the electrical connection 28 includes three electrical phase conductors 54 and one neutral electrical conductor 56.

The electric system 10 then includes four circuit breakers 18 forming a tetrapolar circuit breaker mechanically coupled to the auxiliary apparatus 20.

The auxiliary apparatus 20 then includes three phase current sensors 36, each phase current sensor 36 being associated with a respective phase conductor 54, and a differential current sensor 40 surrounding the three phase conductors 54 and the neutral conductor 56.

The determining application 62 is then able to determine the cause of an opening detected on one of the four circuit breakers 18 based on each of the intensities measured by the phase current sensors 36.

The operation of the third embodiment for each phase conductor 54 is similar to that of the first embodiment described for a single phase conductor 54, and is not described again.

According to this third embodiment, the circuit breakers 18 are additionally associated with a differential trigger 22.

The advantages of this third embodiment are identical to those of the first embodiment.

Figure 11:
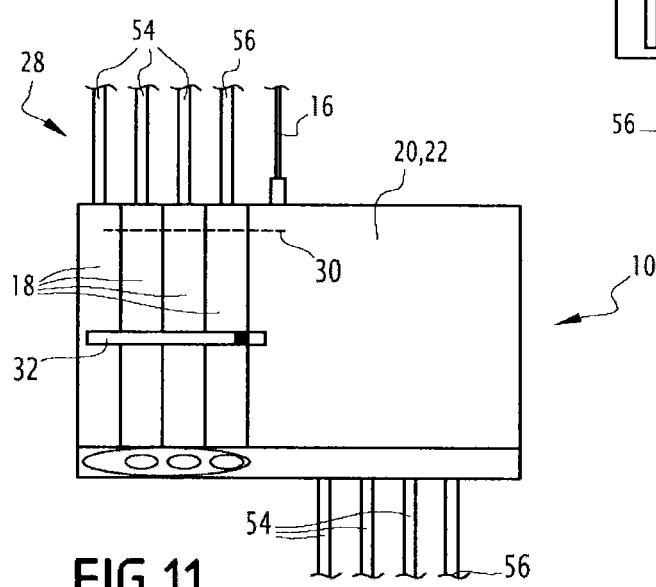
FIGS. 11 and 12 are views similar to that of FIG. 10 according to a fourth and fifth embodiment.
Figure 12:
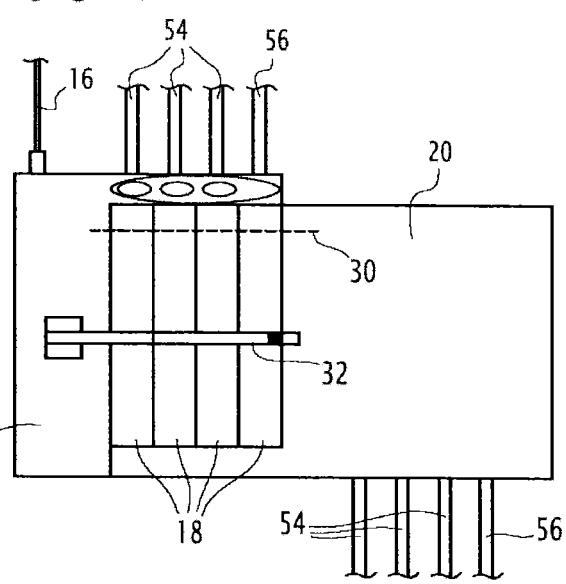

FIGS. 11 and 12 respectively illustrate a fourth and fifth embodiment of the invention, for which the elements similar to the first embodiment, previously described, are identified using identical references, and are not described again.

According to the fourth and fifth embodiments, the current circulating in the electrical connection 28 is, identically to the third embodiment, a three-phase current, and the electrical connection 28 then includes three phase electrical conductors 54 and one neutral conductor 56.

According to the fourth and fifth embodiments, the auxiliary apparatus 20 is positioned to the right of the four circuit breakers 18, while the auxiliary device 20 is positioned to the left of the four circuit breakers 18 in the third embodiment shown in FIG. 10.

One can thus see that the auxiliary apparatus 20 according to the invention allows better monitoring of the circuit breaker 18, in particular the determination of the cause of an opening in case of detection of an opening of the circuit breaker 18 to which the auxiliary apparatus 20 is mechanically coupled is detected.

The invention claimed is:

1. An auxiliary apparatus for an electric circuit breaker, the electric circuit breaker being, in an open position, configured to interrupt circulation of a current in an electrical connection, the electrical connection including at least one electrical conductor, the electric circuit breaker including a mechanical output member, movable between an operating position and a stop position corresponding to the interruption of the circulation of the current in said electrical connection, the auxiliary apparatus comprising:
 a mechanical coupler to mechanically couple with the mechanical output member, the mechanical coupler detecting an opening of the circuit breaker,
 at least one current sensor to measure an intensity of the current circulating in a respective electrical conductor, and
 a processor to determine
  whether the detected opening of the circuit breaker is due to manual operation of the circuit breaker based on a position of the mechanical coupler, and
  if the detected opening of the circuitry breaker is not due to manual operation of the circuit breaker, to determine a cause of the detected opening, based on the intensity measured by the at least one current sensor, the processor being connected to the mechanical coupler and the current sensor.

2. The auxiliary apparatus according to claim 1, wherein the processor compares the intensity measured by the current sensor with at least one predetermined threshold value.

3. The auxiliary apparatus according to claim 2, wherein the processor compares the measured intensity with a first threshold value in order to determine a first cause of opening and with a second threshold value in order to determine a second cause of opening.

4. The auxiliary apparatus according to claim 2, wherein the processor computes a duration during which the measured intensity is above a predetermined threshold value.

5. The auxiliary apparatus according to claim 2, wherein the processor dates an excess of the predetermined threshold value by the measured intensity and the auxiliary apparatus includes a memory to store dates of said excess.

6. The auxiliary apparatus according claim 1, wherein the electric circuit breaker comprises two mechanical output members, a first member among the two mechanical output members being movable in the stop position in case of overload on the electrical connection and the second member being able to be moved into the stop position in case of overload on the electrical connection or manual actuation of the electric circuit breaker, wherein the auxiliary apparatus comprises two mechanical couplers, a first coupler among the two couplers being mechanically coupled with the first output member and the coupler being mechanically coupled with the second output member, and wherein the processor is connected to the first and second mechanical couplers, the cause of the opening being determined based furthermore on a position of the first mechanical output member and a position of the second mechanical output member.

7. The auxiliary apparatus according to claim 1, wherein the auxiliary apparatus further comprises a differential current sensor, and the processor determines the cause of opening based on the intensity measured by each current sensor and a differential current measured by the differential current sensor.

8. An electric system comprising an electric circuit breaker and an auxiliary apparatus mechanically coupled to the electric circuit breaker, the electric circuit breaker being, in an open position, configured to interrupt circulation of an electric current in an electrical connection, the electrical connection including at least one electrical conductor, the electric circuit breaker including a mechanical output member movable between an operating position and a stop position corresponding to the interruption of the circulation of current in said electrical connection, wherein the auxiliary apparatus is according to claim 1.

9. The electric system according to claim 8, wherein the electric system further comprises a differential trigger positioned between the electric circuit breaker and the auxiliary apparatus, the auxiliary apparatus being mechanically coupled to the mechanical output member of the electric circuit breaker.

* * * * *